Figure 1:
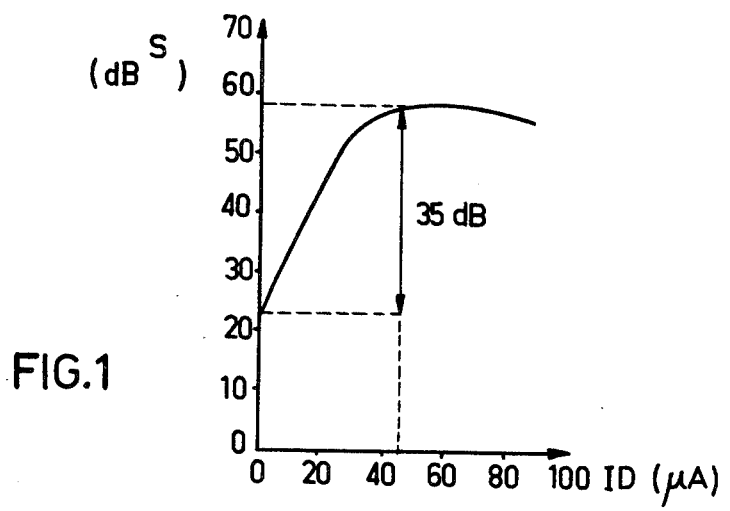

United States Patent [19]

Guennou

[11] 4,149,157

[45] Apr. 10, 1979

[54] RECEIVER FOR A HF-INTRUSION DETECTION SYSTEM

[75] Inventor: Serge Guennou, Croisy-sur-Seine, France

[73] Assignee: U.S. Phillips Corporation, New York, N.Y.

[21] Appl. No.: 799,960

[22] Filed: May 24, 1977

[30] Foreign Application Priority Data

May 26, 1976 [FR] France ................. 76 15985

[51] Int. Cl.² ............................................. G08B 13/24
[52] U.S. Cl. ................................. 340/554; 325/425;
340/552; 343/5 PD
[58] Field of Search ........... 340/258 R, 258 A, 258 B,
340/258 D, 552, 553, 554; 343/5 PD, 7 AG;
325/425; 307/317 A

[56] References Cited

U.S. PATENT DOCUMENTS

| 3,378,834 | 4/1968 | Corbell | 343/5 |
| 3,691,556 | 9/1972 | Bloice | 343/5 PD |
| 3,731,307 | 5/1973 | Charlot, Jr. | 343/7.5 |
| 3,879,719 | 4/1975 | Buckley et al. | 340/258 B |

*Primary Examiner*—Donald J. Yusko
*Assistant Examiner*—Joseph E. Nowicki
*Attorney, Agent, or Firm*—Thomas A. Briody; Bernard Franzblau

[57] ABSTRACT

A receiver in which the detection sensitivity of a detection diode is adjustable as a function of the polarization current, and is controlled by means of a feedback circuit provided with a delay element so that changes in the received signals having a frequency below a value determined by the delay element are eliminated.

10 Claims, 2 Drawing Figures

U.S. Patent   Apr. 10, 1979   4,149,157

RECEIVER FOR A HF-INTRUSION DETECTION SYSTEM

The invention relates to a receiver for a high frequency intrusion detection system comprising a detector for detecting received high frequency energy, an alarm device which is triggered when the strength of the received energy changes, and a feedback circuit for compensating, by controlling the sensitivity of the receiver, amplitude changes of the received high frequency energy having a frequency lower than a predetermined value.

Such an arrangement is disclosed in U.S. Pat. No. 3,378,834.

High-frequency intrusion detection systems comprise a transmitter which radiates high frequency energy which may possibly have been modulated with an auxiliary signal. The energy transmitted by this transmitter may be used for monitoring an area or a space. The receiver may be arranged at some distance opposite to the transmitter and then receives the energy transmitted directly by the transmitter. Interruption of the energy flow between transmitter and receiver by an intruder is then detected. The receiver may also be arranged parallel to the transmitter and then receives only the transmitted energy reflected by an intruder.

If such intrusion detection systems are arranged in an open field, an alarm also is given in the absence of an intruder owing to the motion of plants in the field, by the wind or in the case of heavy rains or heavy snowfall.

It is therefore known from said U.S. Pat. to use an amplifier with a feedback in which a delay element is included. By means of a suitable choice of the delay time of the delay element, any changes caused in the strength of the received high frequency energy due to the motion of plants or rain and snowfall can be controlled to eliminate the effects thereof. However, a receiver provided with such a control requires an additional amplifier.

It is an object of the invention to eliminate in a comparatively simple manner, which requires less components, the changes produced in the received high frequency energy owing to the motion of plants, rain or snowfall.

The receiver in accordance with the invention is therefore characterized in that the detector comprises a detection diode having a detection sensitivity that is adjustable as a function of the value (amplitude) of a direct current flowing through the diode. The diode is connected to a current source for supplying a direct current to the diode. The current source comprises a control terminal to which a control signal is applied for controlling the value of the direct current supplied by the source. The feedback circuit is connected between the detection diode and the control terminal of the current source.

It is advantageous to use a Schottky diode as the detection diode.

The arrangement according to the invention matches the intensity of the direct current through the diode, in particular a Schottky diode, to the level of a detected low frequency signal in such a way that said signal is kept at an approximately constant value.

Figure 2:
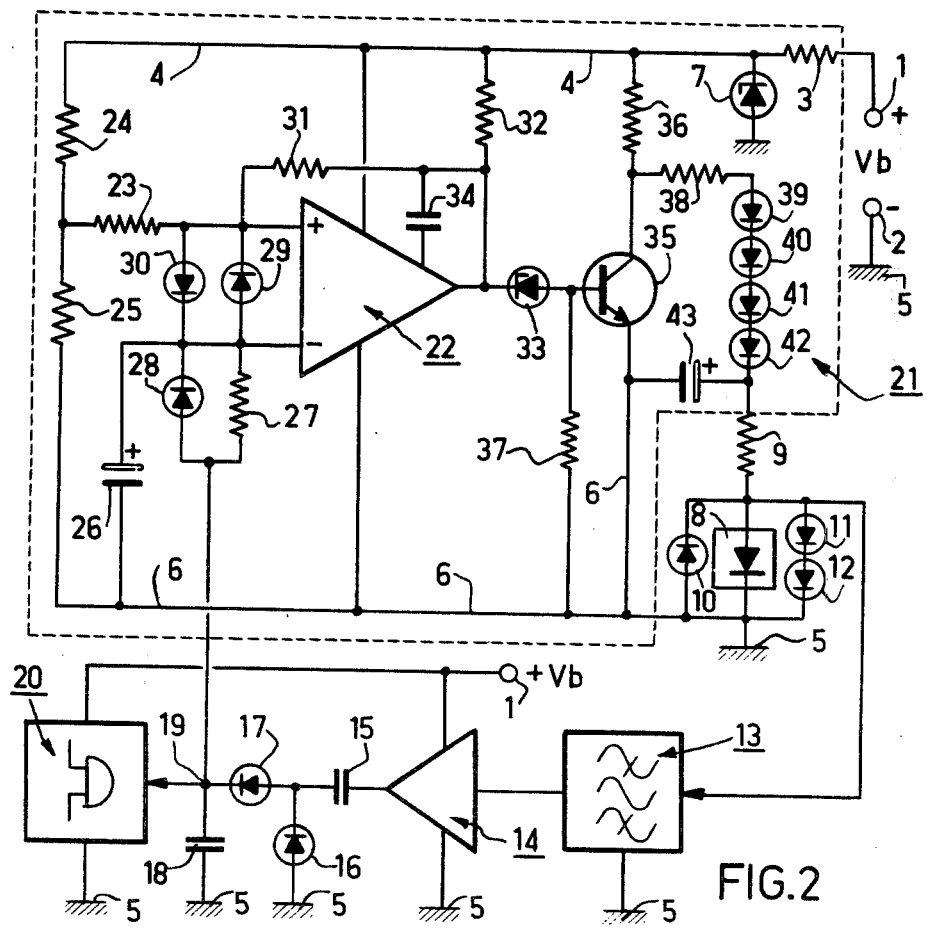

The invention will be further described with reference to the accompanying drawing in which:

FIG. 1 shows a graph of a customary type of Schottky diode, which graph represents the relation between the detection sensitivity and the direct current through the diode and, FIG. 2 shows a diagram of a receiver of high frequency waves for detecting intruders in accordance with the invention.

FIG. 1 shows a graph in which is plotted the detection sensitivity of a detection diode, in particular a Schottky diode marketed by applicants under the designation BAV 97, as a function of a direct current flowing through the diode, called a polarization current hereinafter. The maximum sensitivity is located near a polarization current whose amplitude amounts to approximately $45/\mu A$, whereas the minimum sensitivity is located at a polarization current whose amplitude is equal to zero. A considerable change in sensitivity, which covers approximately 35 dB, is obtained between said current amplitudes. With such a large sensitivity range it is possible to realize an automatic control for keeping the detected signal constant below a given frequency, the sensitivity being matched by the amplitude of the polarization current of the Schottky diode to the level of the low frequency signal detected by this diode.

FIG. 2 shows the positive terminal 1 of a power supply source Vb connected to a conductor 4 through a resistor 3, while the negative terminal 2 of said source is connected to the common ground terminal 5. A conductor 6 is also connected to this ground terminal 5. A zener diode 7 whose anode is connected to the ground terminal 5, is connected between the conductor 4 and the ground terminal 5.

The anode of a Schottky diode 8 is connected to an end of a resistor 9 while the cathode of said diode is connected to the ground terminal 5.

Connected in parallel with the diode 8 is a first protection diode 10 whose pass direction is opposite to that of the pass direction of diode 8 and two series-arranged protection diode 11 and 12 having the same pass direction as the diode 8. Next after diode 8 the detection circuit comprises a bandpass filter 13 tuned to the modulation frequency of the received high frequency energy.

The input of this bandpass filter 13 is connected to the anode of Schottky diode 8 and the output of said filter is coupled to the input of an amplifier 14.

The output of this amplifier 14 is connected through a capacitor 15 to the interconnected cathode and anode of rectifier diodes 16 and 17. The anode of the diode 16 is connected to the ground terminal 5, and a capacitor 18 is arranged between the cathode of the second diode 17 and said ground terminal 5.

The point 19 which is common to the diode 17 and the capacitor 18 is connected to the input of an audio alarm device 20, said circuit 20 and the amplifier 14 being fed by the voltage source Vb already mentioned. The bandpass filter 13, the amplifier 14, and the rectifying circuit 15, 16, 17, 18 and 19 are not only a part of the detection circuit of the receiver, but they are also part of a feedback circuit. This feedback circuit furthermore comprises a threshold device which comprises a comparison circuit 22. A first input (+) of this comparison circuit 22 is connected through a resistor 23 to a voltage divider 24, 25 which is disposed between the positive conductor 4 and the negative conductor 6. There is a second input (−) of comparison circuit 22 which, relative to the conductor 6, is uncoupled by an electrolytic capacitor 26. This second input (−) also is connected to the point 19 through a resistor 27 which is arranged in parallel with a diode 28 whose anode is connected to said point 19.

Two diodes 29 and 30 are arranged in anti-parallel and disposed between the pair of inputs of the comparison circuit 22. The comparison circuit is energized via the conductors 4 and 6.

The output of the comparison circuit 22 is connected to the first input (+) of this circuit through a resistor 31, to the conductor 4 through a resistor 32, and to the cathode of a Zener diode 33. Furthermore a capacitor 34 is disposed between the output of the circuit 22 and a control tap for the frequency response of said circuit 22.

The anode of the Zener diode 33 is connected to a control terminal of a current source which supplies a polarization current to the diode 8. This current source comprises the supply voltage source Vb and a resistor 36 which is coupled to a pole of the power supply source. A parallel arrangement made up of two branches is connected between the resistor 36 and the other pole of the power supply source. The main current source of a transistor 35 whose collector is connected to the resistor 36 is located in one of the branches of the parallel arrangement and with the emitter electrode of said transistor 35 connected directly to conductor 6. The control terminal of the current source is constituted by the base of transistor 35 which is connected to the conductor 6 through a resistor 37.

The other branch of the parallel arrangement includes the series arrangement of a resistor 38, four diodes 39, 40, 41 and 42, a resistor 9 and the diode 8. In addition an electrolytic capacitor 43 is disposed between the junction of the cathode of the diode 42 with the resistor 9 and the negative conductor 6.

The receiver arrangement operates as follows, leaving the presence of the section indicated by reference numeral 21 out of consideration for the time being. In other words, it is assumed that a polarization current whose intensity is constant flows through the Schottky diode 8.

A received modulated high frequency signal is detected by the diode 8 and supplied to the bandpass filter 13 which is tuned to the modulation frequency of the high frequency wave, for example, a modulation frequency of 10 kHz. The sinusoidal signal obtained in this manner is amplified in an amplifier 14 and thereafter applied to the rectifier and voltage doubler circuit which is formed by the capacitors 15, 18 and the diodes 16 and 17. The positive voltage obtained at point 19 is applied to the audio alarm device 20 which is triggered when the voltage at its input becomes smaller than a given threshold voltage.

In the case considered here, wherein the diode 8 functions at a polarization current with constant intensity, it can be seen that a reduction in the voltage at point 19 may be caused by the presence of an intruder in the path which is followed by the wave beam which reaches the diode 8, as well as by a gust of heavy rain or a heavy snowfall in said path.

With the aid of the portion 21 of the receiver arrangement it is possible, on the one hand, to distinguish to a very large extent between the voltage changes at the point 19 which are due to the presence of an intruder and, on the other hand, the voltage changes at the point 19 which are due to weather conditions.

The comparison circuit 22 comprises an operational amplifier whose gain factor is determined by the ratio between the ohmic values of the resistors 23 and 31 and whose frequency response is determined by the capacitor 34.

The voltage occurring at the point 19 is compared with the difference voltage which is supplied by the resistance bridge 24 and 25, the maximum voltage transient being limited by the diodes 29 and 30 which are disposed in anti-parallel between the two inputs. Owing to the presence of the capacitor 26 and the resistor 27, the latter being connected in parallel with the diode 28, an increase in the voltage at the point 19 is directly transferred by the diode 28 to the comparison circuit whereas, in the case of a sudden voltage decrease, the input voltage of the comparison circuit slowly reduces due to the blocking effect of the diode 28 which forces the capacitor 26 to discharge across the resistor 27.

The output signal of the comparison circuit 22 is applied as a control signal through the Zener diode 33 to the base electrode of the transistor 35 so that the average value of the output signal is clamped onto approximately half the value of the supply voltage supplied from the Zener diode 7.

At the optimum propagation conditions of the high frequency waves between a transmitter and the detection diode 8, the latter supplies a maximum amplitude-demodulated signal, which after amplification and rectification tries to adjust the point 19 to a high voltage value. Then the comparison circuit 22 supplies a current which increases the current of the transistor 35 so that a portion of the polarization current of the diode 8 is passed on to the resistors 36, 38, the diodes 39 to 42 and the resistor 9. As the sensitivity of the diode 8 reduces, the voltage occurring at the point 19 also has a tendency to decrease.

In the reverse case a deterioration in the propagation conditions of the high frequency waves, which tends to effect a decrease at the voltage in the point 19, causes an increase in the intensity of the polarization current of the diode 8 and, consequently, an increase in the sensitivity of this diode (FIG. 1).

Ultimately an equilibrium condition is created in the arrangement in which a voltage at the point 19 is approximately constant and is kept constant when the propagation conditions of the high frequency wave in the area to be protected are subjected to slow variations.

On the other hand, the audio alarm device 20 is triggered when an intruder penetrates into the protected area 9 because the sudden decrease at the voltage in the point 19, which is the result of the intrusion, cannot be immediately compensated owing to the discharge time of the capacitor 26. This discharge can only occur through the resistor 27 as the diode 28 is cut-off.

To effectively detect the presence of an intruder the receiver is made sensitive by the presence of the diode 28. It is known that the motion of an object in a beam of high frequency waves is accompanied by a Doppler effect which manifests itself in a modulation of the detected low frequency signals. This Doppler modulation produces voltage peaks at the point 19 which are passed by the diode 28 and effect a reduction of the intensity of the polarization current of the diode 8, and, consequently, a reduction of the average voltage at the point 19.

The delay in swtich-on of the audio alarm device 20 is reduced in that manner so that the guarded area in which the detection system is sensitive is enlarged and within which the presence of an intruder can be detected with certainty.

The circuit constituted by the diodes 39 to 42 determines a threshold voltage which is higher than the saturation voltage of the transistor 35, such that the polarization current of the diode 8 may possibly be suppressed fully in order to obtain the minimum detection sensitivity.

The components used in the embodiment of FIG. 2 may have the following values:

| | |
|---|---|
| Comparison circuit 22 | TCA 520B |
| Transistor 35 | BC 548B |
| Supply source Vb | 12 Volts |
| Diodes | |
| Diode 28 | AAZ 15 |
| Diodes 29, 30, 39, 40, 41, 42 | BAX 14 |
| Zenerdiode 7 | 9 Volts |
| Zenerdiode 33 | 5 Volts |
| Resistors | |
| Resistor 9 | 470 KΩ |
| Resistor 23 | 1 KΩ |
| Resistor 24 | 3.9 KΩ |
| Resistor 25 | 4.7 KΩ |
| Resistor 27 | 1.5 MΩ |
| Resistor 31 | 100 KΩ |
| Resistors 32, 36, 37 | 12 KΩ |
| Resistor 38 | 330 KΩ |
| Capacitors | |
| Capacitor 26 | 47 μF |
| Capacitor 34 | 100 pF |
| Capacitor 43 | 150 μF |

What is claimed is:

1. A receiver for a high frequency intrusion detection system comprising, a detection diode for detecting high frequency energy received by the receiver and for deriving a control signal determined by said received energy, the detection diode being of the type that exhibits a variation in its detection sensitivity as a function of the amplitude of a direct current flowing through said diode, an alarm device which is triggered into operation upon a given change in the amplitude of a signal applied to its input, a current source having a control terminal for receiving a control signal that controls the amplitude of direct current supplied by the current source, means connecting the detection diode to the current source so that the current source supplies a direct current to the diode that controls its detection sensitivity, and a feedback circuit coupling the output of the detection diode to the input of the alarm device and to the control terminal of the current source, the feedback circuit having a delay time for compensating amplitude changes in said control signal which have a frequency below a predetermined value.

2. A receiver as claimed in claim 1 wherein the feedback circuit comprises a bandpassfilter connected to the detection diode, a rectifying circuit coupled to the bandpass filter, a delay element connected to the rectifying circuit, a diode connected in parallel with the delay element, a threshold device connected to the delay element and having an output coupled to the control terminal of the current source, the current source comprising a voltage source, a resistor connected to a terminal of the voltage source and a parallel circuit connected between said resistor and another terminal of the voltage source, one branch of the parallel circuit comprising the detection diode and the other branch a main current path of a transistor having a base electrode which constitutes the control terminal of the current source.

3. A receiver as claimed in claim 1 wherein the detection diode comprises a Schottky diode.

4. A receiver as claimed in claim 1 wherein the current source comprises, a source of voltage having a pair of terminals, a parallel circuit comprising first and second branches, the first branch including a plurality of series connected diodes connected in series with said detection diode and the second branch including the emitter-collector current path of a transistor having a base electrode that comprises the control terminal of the current source, a resistor, and means connecting the resistor and the parallel circuit in series across said pair of terminals of the voltage source.

5. A receiver as claimed in claim 4 wherein said plurality of series connected diodes have a total forward voltage in the forward conduction direction that exceeds the saturation voltage of said transistor.

6. A receiver as claimed in claim 2 wherein said one branch of the parallel circuit further comprises a plurality of series connected diodes which have a total forward voltage in the forward conduction direction that exceeds the saturation voltage of said transistor.

7. In an intrusion detection system including a high frequency transmitter and receiver arranged in spaced relationship, an improved receiver for said system comprising, a detection diode for detecting high frequency energy received by the receiver and for deriving a control signal determined thereby, said diode exhibiting a variation in detection sensitivity as a function of a DC current flowing therein, an alarm device triggerable into operation in response to a given amplitude change of an applied input signal, a current source having a control terminal and coupled to the detection diode to supply a DC current thereto adjustable as a function of a control signal applied to said control terminal, a detection circuit having an input coupled to the detection diode and an output coupled to the input of the alarm device, and a compensation circuit including time delay means and coupled between the output of the detection circuit and the current source control terminal and responsive to an amplitude change in the received high frequency energy of a frequency below a given value to adjust a control signal coupled to said control terminal so as to vary the DC current supplied thereby to the detection diode and thereby adjust the diode detection sensitivity as a function of said amplitude change in the received high frequency energy and in a sense to minimize any change in the control signal derived by the detection diode that otherwise would occur for signal frequencies below said given value.

8. A receiver as claimed in claim 7 wherein the detection diode comprises a Schottky diode.

9. A receiver as claimed in claim 8 wherein the received high frequency energy includes a modulation frequency component and the detection circuit includes a filter tuned to said modulation frequency and a rectifier circuit connected in cascade between the input and output of the detection circuit.

10. A receiver as claimed in claim 8 wherein the compensation circuit comprises a threshold device having an input coupled to the output of the detection circuit via an impedance element and a diode connected in parallel, and means coupling the output of the threshold device to the current source control terminal.

* * * * *